(12) United States Patent
Kang et al.

(10) Patent No.: US 8,003,439 B2
(45) Date of Patent: Aug. 23, 2011

(54) BOARD ON CHIP PACKAGE AND MANUFACTURING METHOD THEREOF

(75) Inventors: Myung-Sam Kang, Daejeon (KR); Chang-Sup Ryu, Yongin-si (KR); Jung-Hyun Park, Cheongju-si (KR); Hoe-Ku Jung, Daejeon (KR); Ji-Eun Kim, Gwangmyeong-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 314 days.

(21) Appl. No.: 12/385,316

(22) Filed: Apr. 3, 2009

(65) Prior Publication Data

US 2009/0206468 A1  Aug. 20, 2009

Related U.S. Application Data

(62) Division of application No. 11/715,906, filed on Mar. 9, 2007, now Pat. No. 7,550,316.

(30) Foreign Application Priority Data

Mar. 10, 2006  (KR) .................. 10-2006-0022844

(51) Int. Cl.
*H01L 21/00* (2006.01)
(52) U.S. Cl. .................. 438/108; 438/112; 438/612
(58) Field of Classification Search .......... 438/106–127, 438/611–617, E21.503
See application file for complete search history.

(56) References Cited

U.S. PATENT DOCUMENTS

| 7,081,403 | B1 | 7/2006 | Kirloskar et al. | 438/612 |
| 7,507,602 | B2 * | 3/2009 | Sunohara | 438/108 |
| 2006/0163722 | A1 * | 7/2006 | Hsu | 438/613 |
| 2008/0003716 | A1 | 1/2008 | Takahashi | 438/108 |
| 2008/0009098 | A1 | 1/2008 | Lee et al. | 438/109 |
| 2010/0019368 | A1 * | 1/2010 | Shin | 257/686 |

OTHER PUBLICATIONS

U.S. Appl. No. 11/715,906, filed Mar. 9, 2007, Myung-Sam Kang, et al., Samsung Electro-Mechanics Co., Ltd.

* cited by examiner

*Primary Examiner* — Cuong Q Nguyen

(57) ABSTRACT

A method of manufacturing a board on chip package including laminating a dry film on a carrier film, one side of which is laminated by a thin metal film; patterning the dry film in accordance with a circuit wire through light exposure and developing process, and forming a solder ball pad and a circuit wire; removing the dry film; laminating an upper photo solder resist excluding a portion where the solder ball pad is formed; etching the thin metal film formed on a portion where the upper photo solder resist is not laminated; mounting a semiconductor chip on the solder ball pad by a flip chip bonding; molding the semiconductor chip with a passivation material; removing the carrier film and the thin metal film; and laminating a lower photo solder resist under the solder ball pad. The board on chip package provides a high density circuit since a circuit pattern is formed using a seed layer.

5 Claims, 8 Drawing Sheets

BOARD ON CHIP PACKAGE AND MANUFACTURING METHOD THEREOF

CROSS-REFERENCE TO RELATED APPLICATIONS

This application is a U.S. divisional application filed under 35 USC 1.53(b) claiming benefit of U.S. Ser. No. 11/715,906 filed in the United States on Mar. 9, 2007, now U.S. Pat. No. 7,550,316, which claims earlier benefit to Korean Patent Application No. 10-2006-0022844 filed with the Korean Intellectual Property Office on Mar. 10, 2006, the disclosure of which is incorporated herein by reference in its entirety.

BACKGROUND OF THE INVENTION

1. Field of the Invention

The present invention relates to a semiconductor chip package and a manufacturing method thereof, more specifically to a board on chip package and a manufacturing method thereof.

2. Description of the Related Art

As electronic devices become smaller, miniature semiconductor chip packages of high performance are required. Accordingly, the widely used is a multi-chip package that has a plurality of semiconductor chips stacked in layers or arrayed laterally on a plane, or a board-on-chip package that combines a semiconductor chip directly to a substrate and seals them.

Unlike a conventional semiconductor chip package that installs a semiconductor chip on a substrate by means of a lead-frame, the board on chip (BoC) mounts a bear die itself directly onto the substrate, reducing thermal and electronic losses due to the high speed of DRAM. Thus, the board on chip is receiving attention as a next-generation high-speed semiconductor substrate appropriate for a high-speed DRAM such as a DDR2. The capacity of the DRAM is increasing rapidly from 128 MB to 256 MB, 512 MB, 1 GB, 2 GB, etc., and accordingly, the substrate should be thinner in order to reduce electronic losses and ensure reliability, A conventional board on chip package has a hole in the center of the substrate to be connected with a semiconductor chip, and this structure was designed to speed up a memory by shortening the distance a signal travels.

FIG. 1 is a sectional view of a board on chip package according to the prior art. Referring to FIG. 1, a conventional board on chip package embodied as a ball grid array package includes a circuit substrate 110 and a semiconductor chip 120. The circuit substrate 110 and the semiconductor chip 120 is electrically connected through a bonding wire 130, of which one end is combined with a bonding pad 140 formed on one side of the semiconductor chip 120 and the other end is combined with a pad 150 formed on the circuit substrate 110. Here, the bonding wire 130 is coated with a molding resin 160, and a plurality of solder balls 170 are formed on one side of the circuit substrate 110 so that the board on chip package can be electrically connected with an external device (not shown) In short, the conventional board-on-chip transmits an electric signal through a bonding wire without forming a via hole in the substrate. Having a minimum length, such a bonding wire hinders the substrate from being thinner. Therefore the conventional board on chip structure is not appropriate for a memory having a large capacity (for example, DRAM).

SUMMARY OF THE INVENTION

The present invention features a board on chip package and a manufacturing method thereof which can cope with rapidly increasing speed and capacity of a memory.

And, the present invention provides a board on chip package and a manufacturing method thereof that do not need an interposer to form the package and a separate process for forming a cavity to mount a semiconductor chip, thereby reducing manufacturing cost.

Also, the present invention provides a board on chip package and a manufacturing method thereof that do not necessitate a wire since a semiconductor chip is mounted on a substrate by a flip chip method.

Moreover, the present invention provides a board on chip package and a manufacturing method thereof that can design a high density circuit since a circuit pattern is formed using a seed layer.

An aspect of the present invention features a manufacturing method of a board on chip package. The method can comprise: (a) laminating a dry film on a carrier film, one side of which is laminated by a thin metal film; (b) patterning the dry film in accordance with a circuit wire through light exposure and developing process, and forming a solder ball pad and a circuit wire; (c) removing the dry film; (d) laminating an upper photo solder resist excluding a portion where the solder ball pad is formed; (e) etching the thin metal film formed on a portion where the upper photo solder resist is not laminated; (f mounting a semiconductor chip on the solder ball pad by a flip chip bonding; (g) molding the semiconductor chip with a passivation material; (h) removing the carrier film and the thin metal film; and (i) laminating a lower photo solder resist under the solder ball pad.

The carrier film can be an insulation layer, and the thin metal film can be formed of copper.

The carrier film can be formed of copper (Cu), and the thin metal film can be formed of nickel (Ni), wherein the thickness of the carrier film can be between 30 μm and 40 μm.

The method can further comprise surface-treating the solder ball pad by applying tin (Sn) and laminating an organic compound on the circuit wire.

Or, the method can comprise: (a) laminating a first dry film on a carrier film, one side of which is laminated by a thin metal film; (b) patterning the first dry film in accordance with a circuit wire through light exposure and developing process, and forming a solder ball pad and the circuit wire; (c) removing the first dry film; (d) laminating a second dry film excluding a portion where the solder ball pad is formed; (e) etching the thin metal film formed on a portion where the second dry film is not laminated; (f) surface-treating the solder ball pad by applying tin (Sn); (g) removing the second dry film; (h) mounting a semiconductor chip on the solder ball pad by a flip chip bonding; (i) molding the semiconductor chip with a passivation material; (j) removing the carrier film and the thin metal film; and (k) laminating a photo solder resist under the solder ball pad.

The carrier film can be an insulation layer, and the thin metal film can be formed of copper.

The carrier film can be formed of copper (Cu), and the thin metal film can be formed of nickel (Ni), wherein the thickness of the carrier film can be between 30 μm and 40 μm.

The method can further comprise laminating an organic compound on the circuit wire.

Another aspect of the present invention features a board on chip package. The package can comprise a photo solder resist having a cavity and a pattern on one side, the pattern being corresponding to a circuit wire, a solder ball pad accommodated in the cavity, a circuit wire electrically connected with the solder ball pad, and formed on the other side of the photo solder resist, a semiconductor chip mounted on the solder ball pad by a flip chip bonding; and a passivation material for molding the semiconductor chip.

Or, the package can comprise a photo solder resist having an area and a pattern, a semiconductor chip being mounted on the area, the pattern being formed in accordance with a circuit wire, a circuit wire formed in one side of the photo solder resist, and having a pattern, a solder ball pad formed on one side of the photo solder resist, and electrically connected with the circuit wire, a semiconductor chip mounted on the solder ball pad by a flip chip bonding; and a passivation material molding the semiconductor chip.

Additional aspects and advantages of the present general inventive concept will be set forth in part in the description which follows, and in part will be obvious from the description, or may be learned by practice of the general inventive concept.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE PREFERRED EMBODIMENTS

Hereinafter, embodiments of the invention will be described in more detail with reference to the accompanying drawings. In the description with reference to the accompanying drawings, those components are rendered the same reference number that are the same or are in correspondence regardless of the figure number, and redundant explanations are omitted.

In addition, prior to describing embodiments of the present invention, a method for manufacturing a general substrate will be described first. Although a method for manufacturing a multi-layer substrate is described below, the present invention is by no means restricted to the following method for manufacturing a multi-layer substrate.

First, an internal circuit pattern is formed on the outside of a core layer. An inner-layer base material that meets the product specification is cut, and a predetermined internal circuit pattern is formed using a dry film and a working film. Here, the inner layer can be scrubbed, and an inner layer dry film can be laminated, and the inner layer can be exposed and developed.

Then, prior to bonding the inner layer, on which the circuit pattern is formed, to the outer layer, a brown (black) oxide process is carried out in order to strengthen the adhesion. That is, the surface of a copper foil is chemically oxidized to enhance the surface roughness such that the lamination results in better adhesion. Then, by laminating the inner-layer substrate and a prepreg, prelamination and lamination processes are carried out.

Then, the laminated inner layer substrate and the prepreg are vacuum pressed. It is possible that the laminated inner layer substrate and the prepreg are hot pressed or cool pressed, instead of being vacuum pressed.

The resin and copper foil are trimmed from the corners of the panel, and an X-ray target drilling process, in which a hole is made at a target guide mark on the inner layer circuit, is carried out in preparation of a drilling process.

Then, the drilling process is carried out for electric conduction between the layers of the substrate. Here, a computer numerical control (CNC) method can be used for the drilling process.

Then, the outer layer is coated with the dry film and the working film in order to form a circuit pattern, exposed to a light of a predetermined intensity for a predetermined duration, and the unirradiated portions are developed in an etching process. After examining the outer layer and measuring the scale, a solder resist exposure film is designed and manufactured. Then, a preprocess, such as brush polishing, in which the surface of copper foil is made rough such that the solder resist ink is better adhered to the substrate, is carried out. The solder resist is then coated; the solder resist is exposed using the solder resist exposure film, designed adaptively in the preceding process; the solder resist is removed in a development process; and a variety of postprocesses, including electric/final tests, are carried out.

Figure 1:
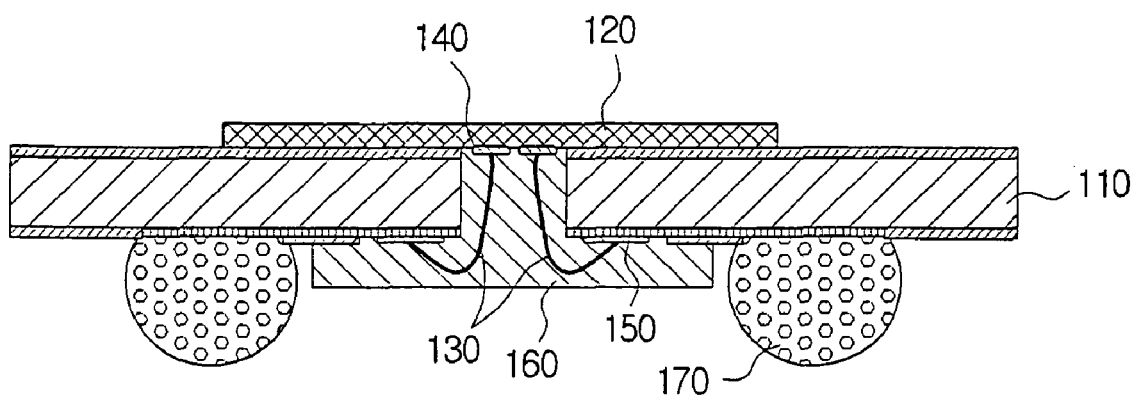
FIG. 1 is a sectional view of a board on chip package according to the prior art.
Figure 2:
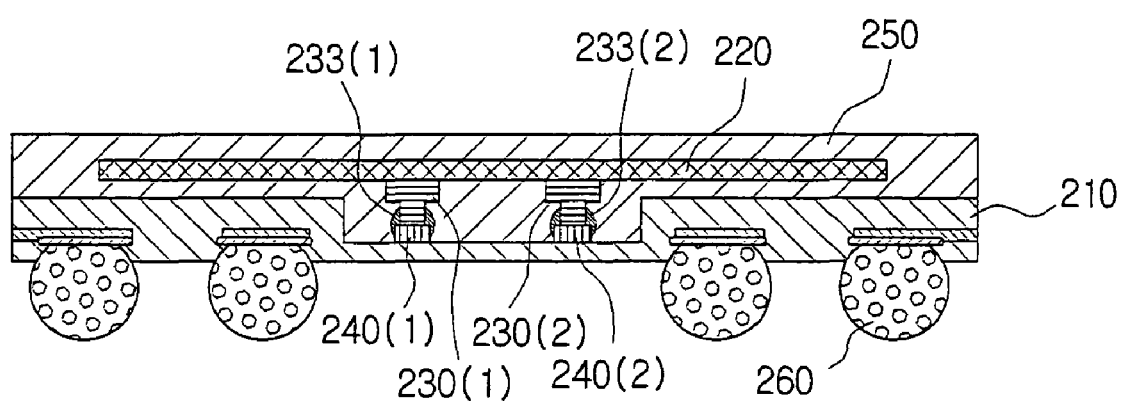
FIG. 2 is a sectional view of a board on chip package according to an embodiment of the present invention.

FIG. 2 is a sectional view of a board on chip package according to an embodiment of the present invention. Referring to FIG. 2, a board on chip package according to the present invention includes a photo solder resist 210, a semiconductor chip 220, a bump 230(1), 230(2), a solder lump 233(1), 233(2), a solder ball pad 240(1), 240(2), a passivation material 250, and a solder ball 260. The semiconductor chip 220 is an integrated chip capable of a high speed signal processing, and is mounted, by a flip chip method, in a cavity formed in the photo solder resist 210. Then, the bump 230(1), 230(2) is electrically connected directly to the solder ball pad 240(1), 240(2), which is accommodated in the cavity formed in the photo solder resist 210. Here, on one side of the photo solder resist 210 are formed a cavity and a pattern corresponding to a circuit wire. The solder ball pad 240(1), 240(2) and the circuit wire are electrically connected, allowing the semiconductor chip 220 to communicate a signal with the circuit wire. Also, the semiconductor chip 220 is mounted directly on the photo solder resist 210 by the flip chip method, and thus the overall thickness of the package is thin enough not to require an interposer to form a space between the photo solder resist 210 and a substrate (not shown) formed on top of the semiconductor chip 220.

The passivation material 250 is a molding resin such as an epoxy, and is formed on four sides of the semiconductor chip 220, to protect the semiconductor chip 220 from electrical and chemical external factors. The bump 230(1), 230(2) can be an aurum (Au) bump, a solder bump, etc, and the solder ball pad 240(1), 240(2) can be formed of a conductive metal such as aurum (Au) or copper (Cu). The bump and the pad, described below, are made of the same material as above.

The solder lump 233(1), 233(2) combines the bump 230(1), 230(2) and the solder ball pad 240(1), 240(2). In order to combine the board on chip package and an external device, the solder ball 260 is electrically combined to the circuit wire formed in the board on chip package. Here, the surface of the solder ball pad 240(1), 240(2) is treated by a material such as Tin to prevent oxidation. Also, the circuit wire, combined with the solder ball 260, can be surface-treated in a variety of ways, in order to prevent oxidation. The surface treatment, preventing oxidation, can be a hot air solder leveling (HASL), an electroless gold plating, an organic solderability preservative (OSP) plating, an electroless tin plating, an electroless antigen plating, a palladium plating, etc. The OSP plating keeps the copper surface from air by applying organic compound on a printed circuit board, in order to prevent oxidation. The OSP plating is also called as a pre-flux treatment since the organic compound is similar to flux. If the organic compound is not applied equally on the surface of the printed circuit board pad, the copper film can be oxidized, causing a problem when both-sided reflow soldering is performed. Therefore, a rapid treatment is required after opening a vacuum packing.

The above description concentrates on a board on chip package. Hereinafter, a manufacturing method of a board on chip package according to the present invention will be described with reference to the accompanying drawings. The manufacturing method introduces three embodiments, which will be described one by one.

Figure 3:
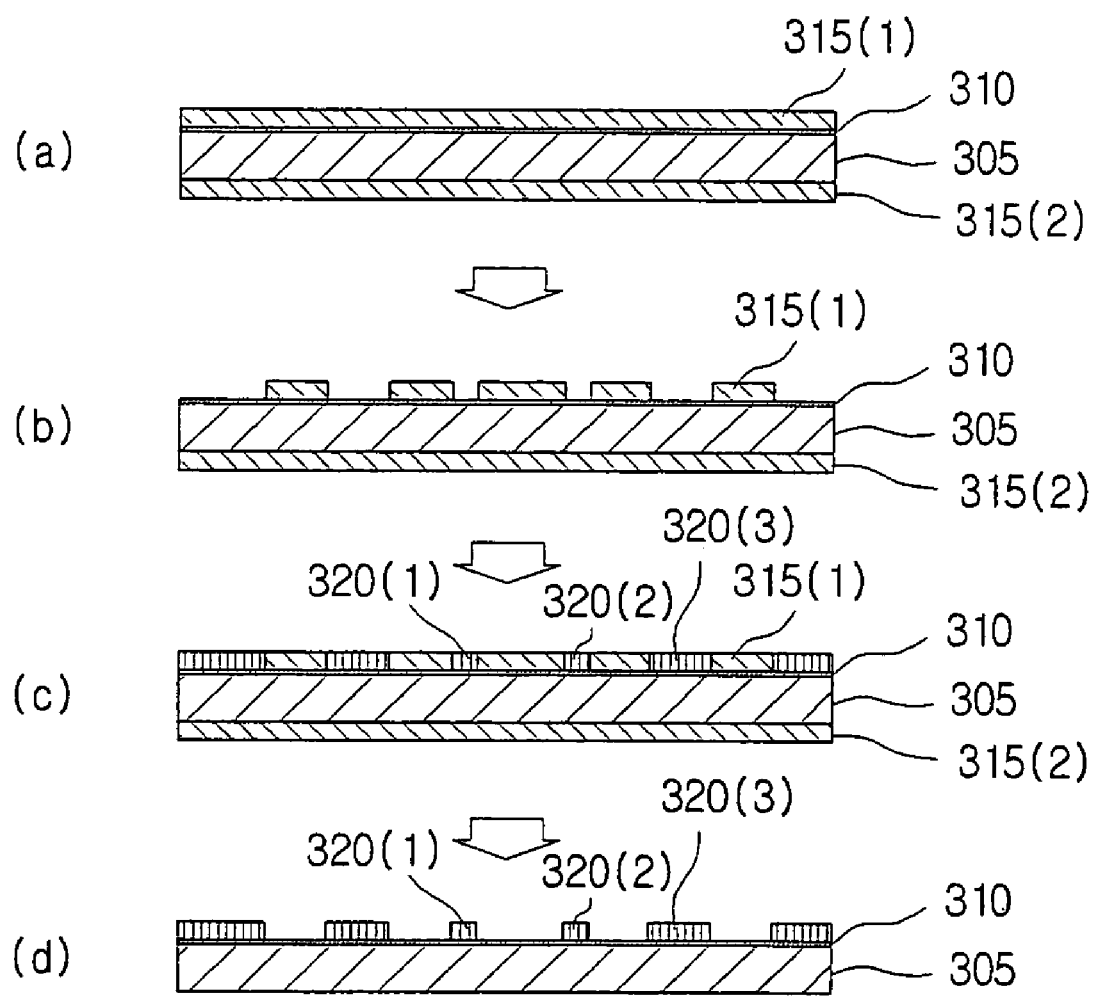
FIGS. 3 and 4 illustrate a manufacturing process of a board on chip package according to a first embodiment of the present invention.
Figure 4:
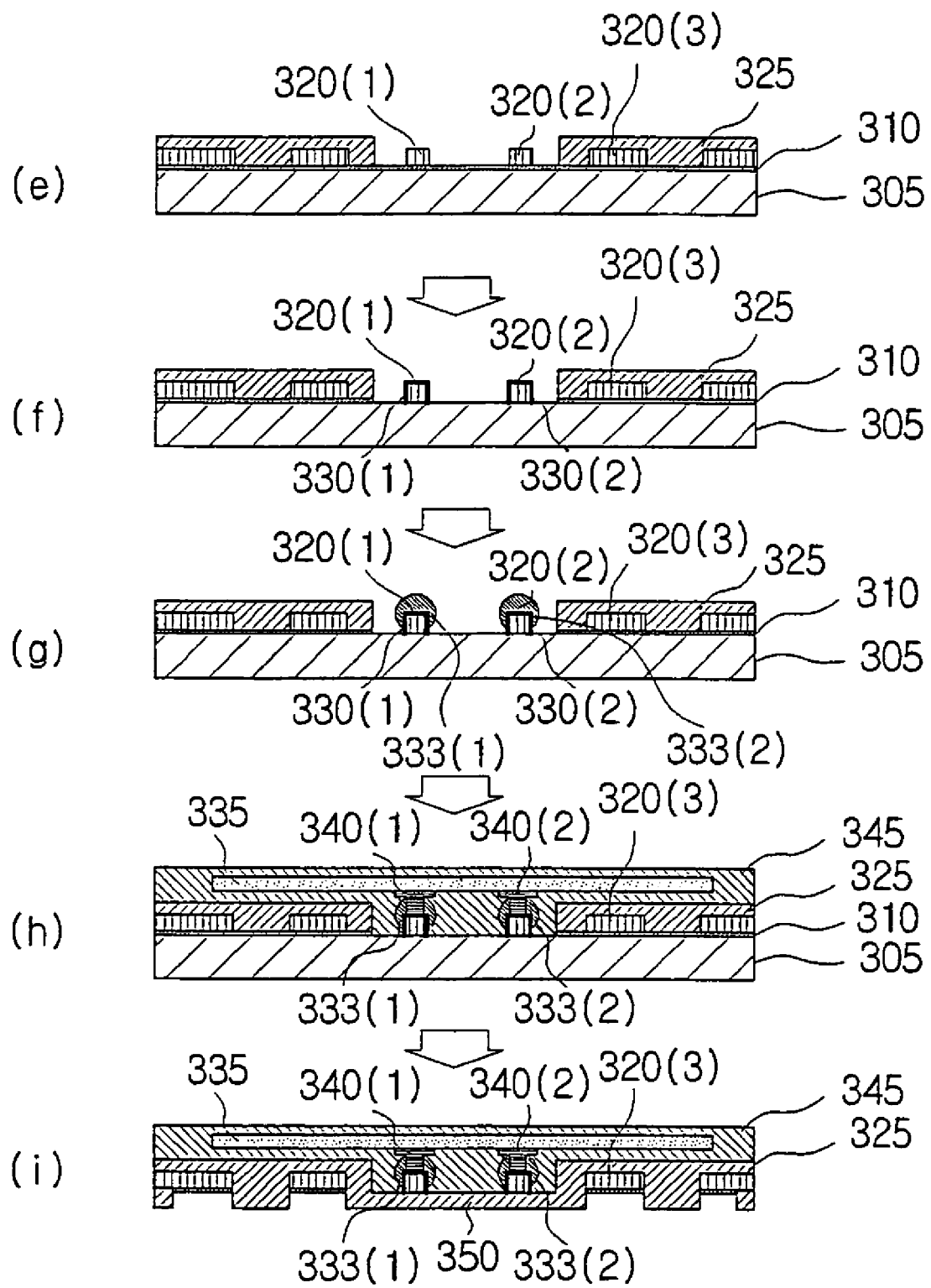

FIGS. 3 and 4 illustrate a manufacturing method of a board on chip package according to a first embodiment of the present invention.

Referring to step (a), a dry film 315(1), 315(2) is laminated on a carrier film 305, on one side of which a thin metal film 310 is laminated. The thin metal film 310 can be laminated on the carrier film 305 by electroless plating. The thin metal film 310 can be composed of copper, and the thickness of the thin metal film 310 can be 3 μm or less.

In order to form a circuit wire, after laminating the dry film 315(1), 315(2) on the carrier film 305, a pattern is formed through light exposure and developing process, and is plated through a semi additive process or a modified semi additive process.

The semi-additive process forms a circuit pattern after forming a copper (Cu) seed layer through electroless plating, using a material that does not have a seed layer. That is, a plating resist is used on the surface of a copper foil, which is on the outer layer of a copper-clad laminate, and the plating resist in the portion where the circuit is to be formed is peeled off through exposure and developing processes. As a result, the surface of the outer copper foil becomes exposed, and the plating resist of only the portion where the circuit is not to be formed remains on the outer layer of the copper foil. By copper-plating on the surface, the plating resist is peeled off to form a copper plated circuit layer on the surface of the exposed outer copper foil, thereby forming a circuit pattern. Once the plating is completed, the remaining plating resist is peeled off, and the copper foil between the wiring in the formed circuits is dissolved off using flush etching, thereby completing the printed circuit board. When the copper foil layer is removed through flush etching, the upper edge of the copper plated circuit layer becomes also eroded, deteriorating the shape of the final printed circuit board as well as the aspect ratio of the cross-section of the circuit. To avoid this, the following process can be also carried out: In the semi-additive method, the copper plated circuit layer and outer layer copper foil layer must have the Rv value, which is Vsc/Vsp, of 1.0 or higher, whereas Vsp is the dissolving speed of the extracted copper constituting the copper plated circuit layer, and Vsc is the dissolving speed of the copper constituting the outer layer copper foil layer. The modified semi-additive process forms a circuit pattern using a material on which copper is laminated from the beginning, that is, a material having a seed layer. The rest of the process is identical to the above semi-additive process. Described below is a method for manufacturing a board on chip package through the modified semi additive process.

Referring to step (b), the dry film 315(1), 315(2) is removed from an area where the circuit wire is to be formed, by performing light exposure and developing process, so that a pattern is formed in correspondence with the circuit wire.

Referring to step (c), the circuit wire 320(3) is formed through the pattern plating process. The process forms a micro circuit wire and a solder ball pad 320(1), 320(2), on which a semiconductor chip is to be mounted.

Referring to step (d), after the pattern plating process, the dry film 315(1), 315(2) is removed from an area where no circuit is formed.

Referring to step (e), after removing the dry film 315(1), 315(2), a photo solder resist 325 is laminated to protect the surface of the circuit. The photo solder resist 325 laminated in the above step, is referred to as an upper photo solder resist, and a photo solder resist 325, that is laminated in a later step, is referred to as a lower photo solder resist. Here, the upper photo solder resist 325 is not laminated on an area where the solder ball pad 320(1), 320(2) is to be formed, in order for the semiconductor chip to be mounted thereon.

Referring to steps (f) and (g), after laminating the upper photo solder resist 325, the thin metal film 310, functioning as a seed layer, is etched from an area where the solder ball pad 320(1), 320(2) is formed, and the surface of the solder ball pad 320(1), 320(2) is treated to prevent oxidation. Then, in order to mount a semiconductor chip, the substrate is cut by strip and a solder lump 333(1), 333(2) is formed on the surface of the solder ball pad 320(1), 320(2).

Referring to step (h), a semiconductor chip 335 is mounted by the flip chip method, and a passivation material (345) (for example, an epoxy resin) is molded to protect the semiconductor chip 335. Here, a bump 340(1), 340(2) formed on the semiconductor chip 335 is coupled with the solder ball pad 320(1), 320(2), respectively.

Referring to step (i), after mounting the semiconductor chip 335 and removing the carrier film 305, the thin metal film (310), functioning as the seed layer, is removed from the area where the circuit is formed. Then, for mounting a board on chip package according to the present invention, in a external device, the surface of the circuit wire 320(3) is surface-treated with the OSP (organic solderability preservative) method, and the lower photo solder resist 350 is laminated corresponding to the circuit wire 320(3) pattern such that the circuit wire 320(2) is not covered.

The carrier film 305 can be an insulation layer, and the carrier film 305 and the dry film 315(1), 315(2) can be developed or removed by an alkaline composition (Na2CO3, K2CO3, NaOH, or KOH).

Figure 5:
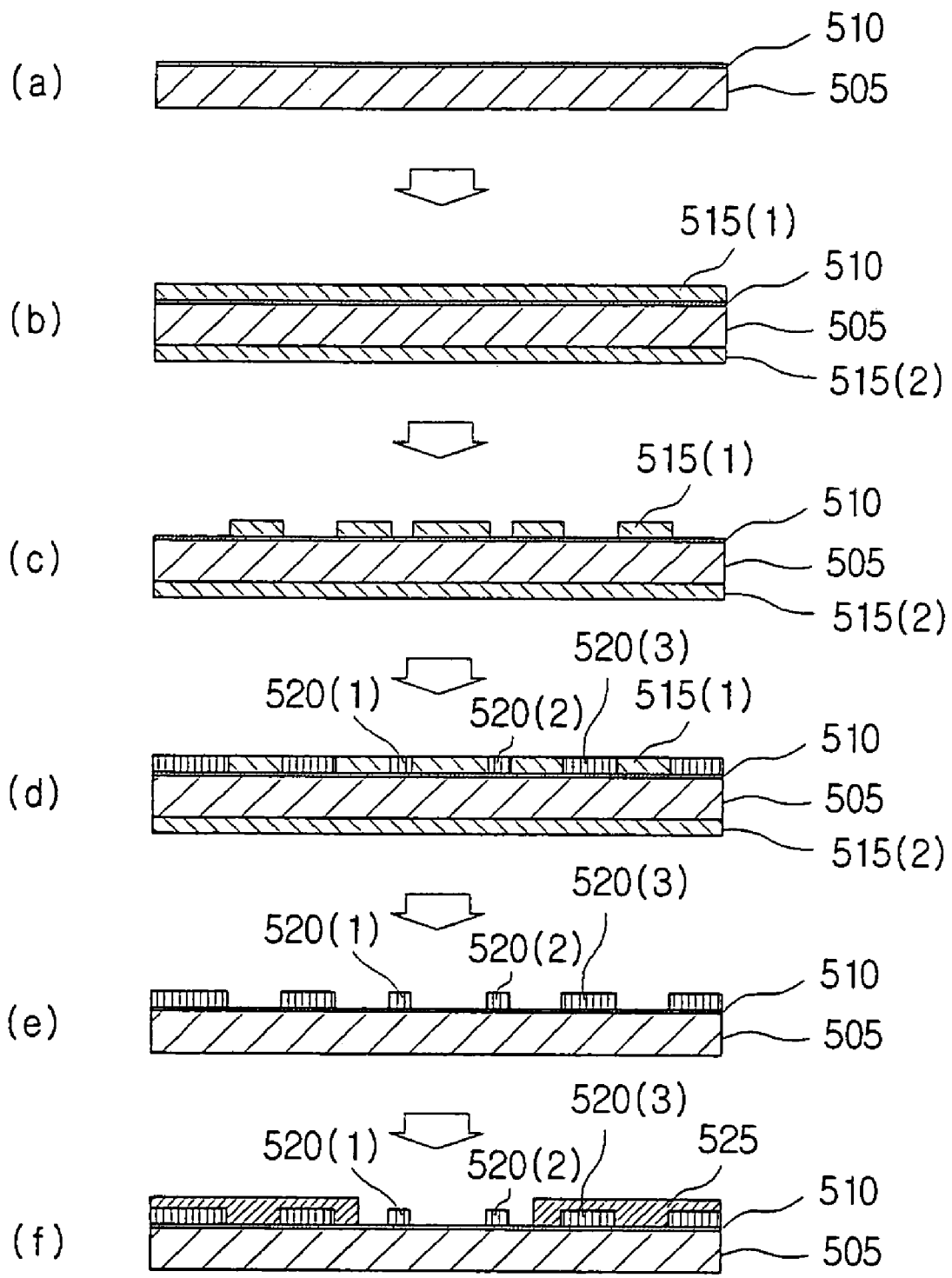
FIGS. 5 and 6 illustrate a manufacturing process of a board on chip package according to a second embodiment of the present invention.
Figure 6:
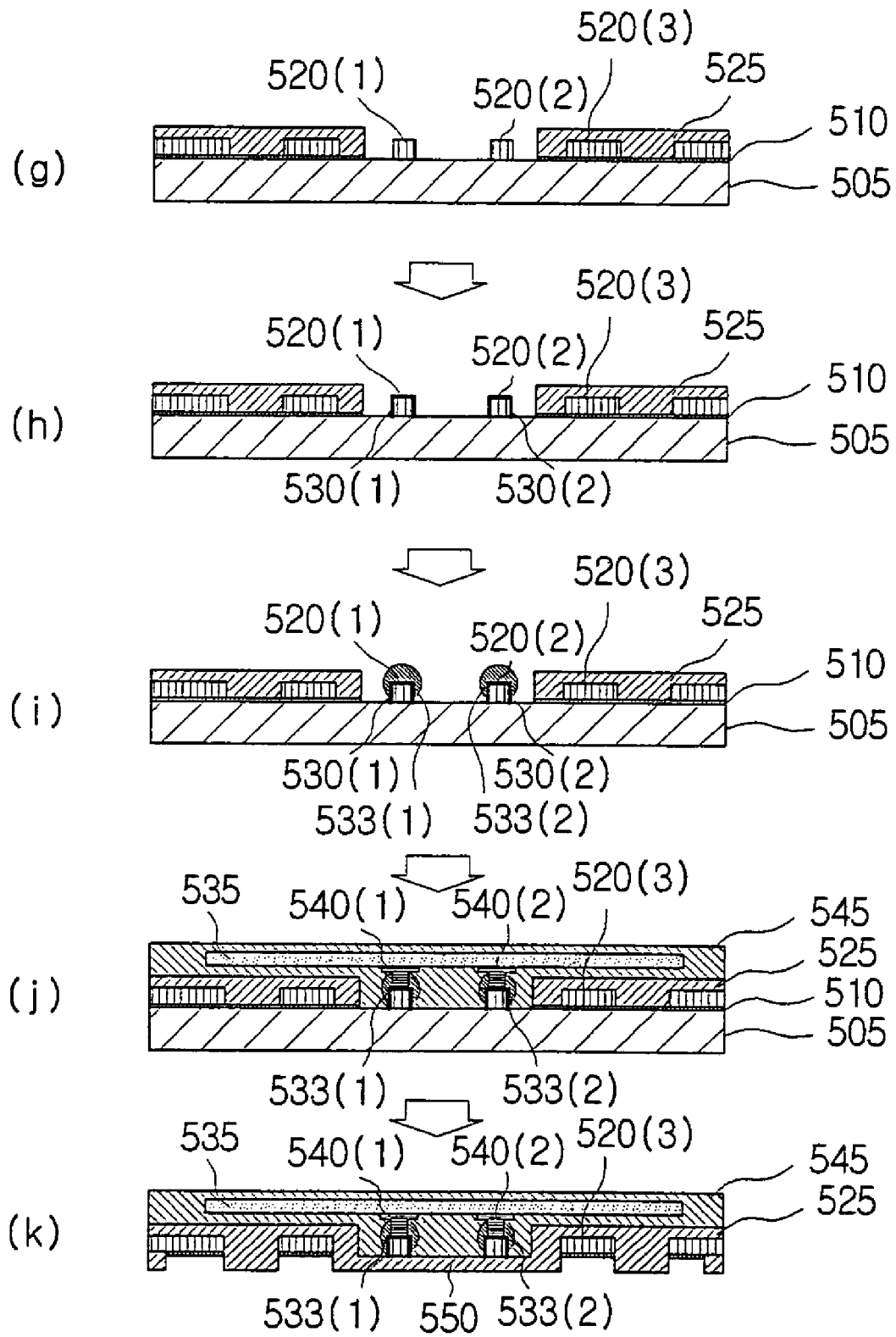

FIGS. 5 and 6 illustrate a manufacturing method of a board on chip package according to a second embodiment of the present invention. The description below emphasizes differences from the first embodiment.

FIGS. 5 and 6 show a carrier film 505, a thin metal film 510, a dry film 515(1), 515(2), a solder ball pad 520(1), 520(2), a circuit wire 520(3), an upper photo solder resist 525, a tin 530(1), 530(2), a solder lump 533(1), 533(2), a semiconductor chip 535, a bump 540(1), 540(2) that is formed on the semiconductor chip 535, a passivation material 545, and a lower photo solder resist 550.

Referring to step (a), the carrier film 505 can be formed of thick copper for an easy handling. Here, the thickness of the copper can be between from 30 μm to 40 μm, and preferably 35 μm. Here, a material other than copper can be used for a seed layer in order to selectively etch the carrier film 505. Examples of such a material include nickel (Ni) and aluminum (Al).

Figure 7:
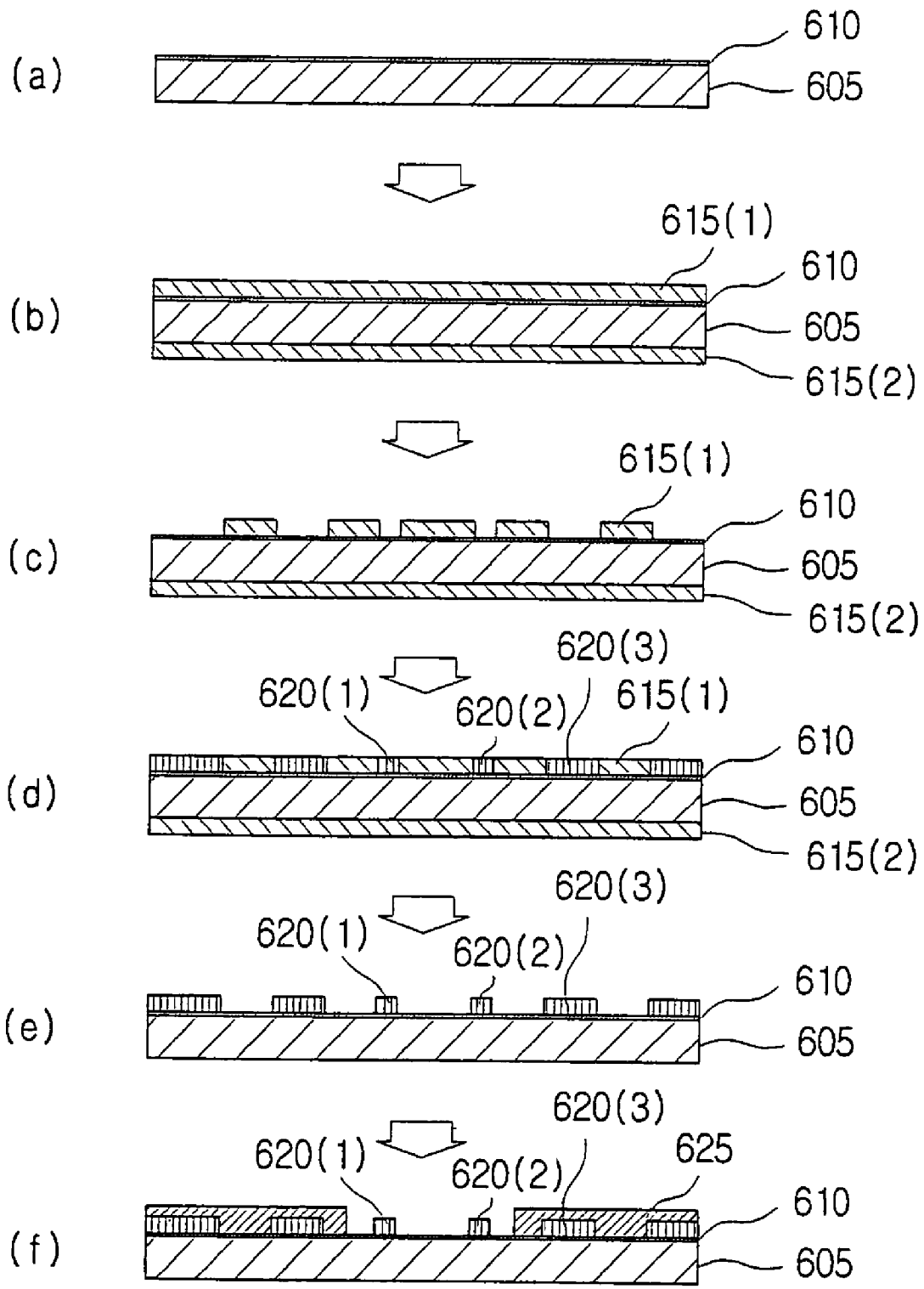
FIGS. 7 and 8 illustrate a manufacturing process of a board on chip package according to a third embodiment of the present invention.
Figure 8:
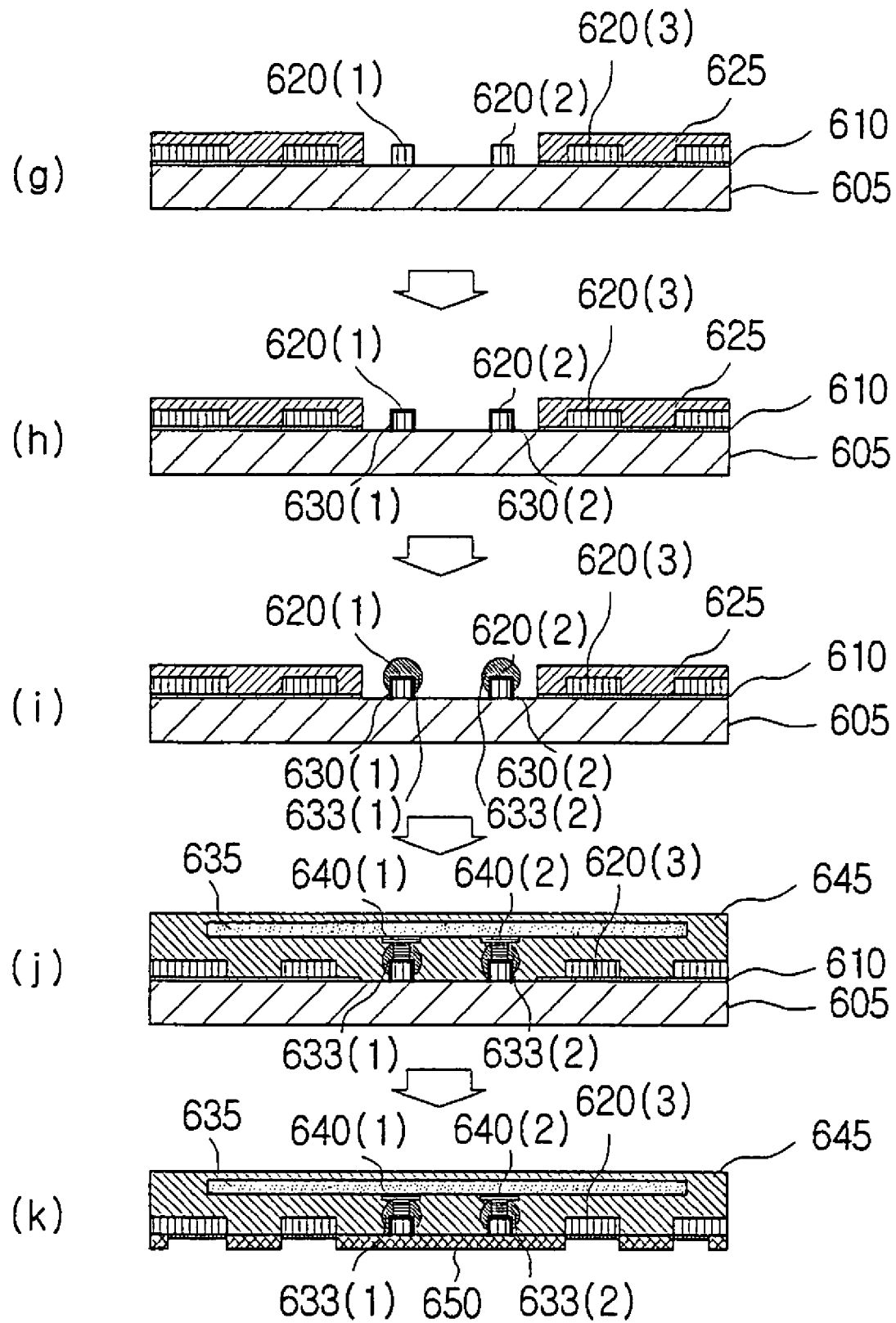

FIGS. 7 and 8 illustrate a manufacturing method of a board on chip package according to a third embodiment of the present invention. The below description emphasizes differences from the second embodiment. FIGS. 7 and 8 show a carrier film 605, a thin metal film 610, a first dry film 615(1), 615(2), a solder ball pad 620(1), 620(2), a circuit wire 620(3), a second dry film (625), a tin 630(1), 630(2), a solder lump 633(1), 633(2), a semiconductor chip 635, a bump 640(1), 640(2) formed on the semiconductor chip 635, a passivation material, and a lower photo solder resist 650.

Referring to step (f) a dry film is laminated instead of an upper photo solder resist. The dry film laminated at step (f) is referred to as a second dry film 625, and a dry film laminated at step (b) is referred to as a first dry film 615(1), 615(2). Here, since the dry film is cheaper than the photo solder resist, laminating the second dry film 625 can reduce costs.

At step (j), the second dry film 625 is removed when the semiconductor chip 635 is mounted, and, at step (k), the lower photo solder resist 650 is laminated to protect the circuit wire 620(3). The lower photo solder resist 650 formed in a board on chip package according to the third embodiment has an area where the semiconductor chip 635 is mounted by a flip chip method, and is patterned in accordance with the circuit wire 620(3). That is, the lower photo solder resist 650 is formed on one side of the board on chip package except the portion where the circuit wire 620(3) is combined with an external device through the solder ball, in order to protect the board on chip package from electrical and chemical external factors.

Here, the solder ball pad 620(1), 620(2) is formed in the portion where the semiconductor chip 635 is mounted. And, the circuit wire 620(3) is patterned on one side of the lower photo solder resist 650. Thus, the solder ball pad 620(1), 620(2) and the circuit wire 620(3) are formed on the same side of the lower photo solder resist 650.

While the invention has been described with reference to the disclosed embodiments, it is to be appreciated that those skilled in the art can change or modify the embodiments without departing from the scope and spirit of the invention or its equivalents as stated below in the claims.

What is claimed is:

1. A method for manufacturing a board on chip package, the method comprising:
    laminating a first dry film on a carrier film, one side of which is laminated by a thin metal film;
    patterning the first dry film in accordance with a circuit wire through light exposure and developing process, and forming a solder ball pad and the circuit wire;
    removing the first dry film;
    laminating a second dry film excluding a portion where the solder ball pad is formed;
    etching the thin metal film formed on a portion where the second dry film is not laminated;
    surface-treating the solder ball pad by applying tin (Sn);
    removing the second dry film;
    mounting a semiconductor chip on the solder ball pad by a flip chip bonding;
    molding the semiconductor chip with a passivation material;
    removing the carrier film and the thin metal film; and
    laminating a photo solder resist under the solder ball pad.

2. The method of claim 1, further comprising laminating an organic compound on the circuit wire.

3. The method of claim 1, wherein the carrier film is an insulation layer, and the thin metal film is formed of copper.

4. The method of claim 1, wherein the carrier film is formed of copper (Cu), and the thin metal film is formed of nickel (Ni).

5. The method of claim 4, wherein the thickness of the carrier film is between 30 μm and 40 μm.

* * * * *